US012288022B2

(12) United States Patent
Pillai et al.

(10) Patent No.: US 12,288,022 B2
(45) Date of Patent: *Apr. 29, 2025

(54) METHODS AND SYSTEMS FOR GENERATING SHAPE DATA FOR ELECTRONIC DESIGNS

(71) Applicant: Center for Deep Learning in Electronics Manufacturing, Inc., San Jose, CA (US)

(72) Inventors: Suhas Pillai, San Jose, CA (US); Thang Nguyen, San Jose, CA (US); Ajay Baranwal, Dublin, CA (US)

(73) Assignee: Center for Deep Learning in Electronics Manufacturing, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/488,823

(22) Filed: Oct. 17, 2023

(65) Prior Publication Data

US 2024/0046023 A1    Feb. 8, 2024

Related U.S. Application Data

(63) Continuation of application No. 17/453,321, filed on Nov. 2, 2021, now Pat. No. 11,847,400, which is a
(Continued)

(51) Int. Cl.
*G06F 30/30*    (2020.01)
*G03F 7/00*    (2006.01)
(Continued)

(52) U.S. Cl.
CPC .......... *G06F 30/398* (2020.01); *G03F 7/705* (2013.01); *G06N 3/045* (2023.01)

(58) Field of Classification Search
CPC .... G06F 30/398; G03F 7/705; G03F 7/70433; G06N 3/045; G06N 3/047; G06N 3/088
See application file for complete search history.

(56) References Cited

U.S. PATENT DOCUMENTS 9,819,258 B1 * 11/2017 Vandam .......... G01R 31/31816
10,430,946 B1 * 10/2019 Zhou .................. A61B 5/02007
(Continued)

FOREIGN PATENT DOCUMENTS

KR    20190094425 A    8/2019

OTHER PUBLICATIONS

Brownlee "How to Implement Pix2Pix GAN Models From Scratch With Keras", https://web.archive.org/web/20191031194611/https://machinelearningmastery.com/how-to-implement-pix2pix-gan-models-from-scratch-with keras/, Dated Jul. 31, 2019 (Year: 2019).
(Continued)

*Primary Examiner* — Jack Chiang
*Assistant Examiner* — Brandon Bowers
(74) *Attorney, Agent, or Firm* — MLO, a professional corp.

(57) ABSTRACT

Methods and systems for generation of shape data for a set of electronic designs include inputting a set of shape data, where the set of shape data represents a set of shapes for a device fabrication process. A convolutional neural network is used on the set of shape data to determine a set of generated shape data, where the convolutional neural network comprises a generator trained with a set of predetermined discriminators. The set of generated shape data comprises a scanning electron microscope (SEM) image.

21 Claims, 8 Drawing Sheets

Related U.S. Application Data continuation of application No. 17/022,363, filed on Sep. 16, 2020, now Pat. No. 11,250,199.

(51) Int. Cl.
  *G06F 30/398* (2020.01)
  *G06N 3/045* (2023.01)

(56) References Cited

U.S. PATENT DOCUMENTS

| | | | | |
|---|---|---|---|---|
| 2010/0084549 | A1* | 4/2010 | Ermakov | H01J 49/4245 |
| | | | | 250/293 |
| 2017/0148226 | A1 | 5/2017 | Zhang et al. | |
| 2017/0345140 | A1* | 11/2017 | Zhang | G06V 10/82 |
| 2019/0214223 | A1 | 7/2019 | Sriraman | |
| 2019/0377849 | A1 | 12/2019 | Sha et al. | |
| 2020/0349681 | A1* | 11/2020 | Andrei | G06V 10/776 |
| 2021/0043331 | A1* | 2/2021 | Ozcan | G16H 30/20 |
| 2021/0103681 | A1* | 4/2021 | Das | H03K 17/687 |

OTHER PUBLICATIONS

Durugkar et al., Generative Mutli-Adversarial Networks, Published as a Conference Paper at ICLR 2017, Nov. 5, 2016, revised Mar. 2, 2017, 14 pages, https://arxiv.org/abs/1611.01673.

Hardy et al., "MD-GAN: Multi-Discriminator Generative Adversarial Networks for Distributed Datasets", 2019 IEEE International Parallel and Distributed Processing Symposium (IPDPS), May 2019 (Year: 2019).

Home page, Artimagen, Jun. 24, 2010, 2 pages, http://artimagen.sourceforge.net.

International Search Report and Written Opinion dated Dec. 13, 2021 for PCT Patent Application No. PCT/IB2021/058173.

Isola et al., Image-to-Image Translation with Conditional Adversarial Networks, Nov. 21, 2016, revised Nov. 26, 2018, 17 pages, https://arxiv.org/abs/1611.07004.

Ledig et al., Photo-Realistic Single Image Super-Resolution Using a Generative Adversarial Network, Sep. 15, 2016, revised May 25, 2017, 19 pages, https://arxiv.org/abs/1609.04802.

Notice of Allowance and Fees dated Aug. 10, 2023 for U.S. Appl. No. 17/453,321.

Notice of Allowance and Fees dated Oct. 20, 2021 for U.S. Appl. No. 17/022,363.

Office Action dated Apr. 2, 2021 for U.S. Appl. No. 17/022,363.

Office Action dated Feb. 3, 2023 for U.S. Appl. No. 17/453,321.

Pang et al., Making Digital Twins using the Deep Learning Kit (DLK), Proc. SPIE 11148, Photomask Technology 2019, Oct. 2019, 13 pages.

* cited by examiner $$\text{Discriminator loss} = \sum_{i=1}^{N} \frac{-(\log(D_s(f(X)|f(Z))+e)+\log(1-D_s(f(G(Z))|f(Z))+e))}{N}$$

$$\text{Generator loss} = \sum_{i=1}^{N} \frac{-\alpha*\log(D_s(f(G(Z))|f(Z))+e)}{N} + \sum_{k=1}^{N} \beta * P_k$$

$$\text{Perceptual loss } (P) = \sum_{k=1}^{K} \frac{l_k}{K}$$

$$l = \sum_{i=1}^{W} \sum_{j=1}^{H} \sum_{k=1}^{C} \frac{|\phi_{i,j,k}(f(X)|f(Z)) - \phi_{i,j,k}(f(G(Z))|f(Z))|}{W*H*C}$$

D - Discriminator
G - Generator
X - Real SEM Image
Z - Simulated CAD data
G(Z) - Generated SEM Image
f - Resizing function
P - Perceptual loss
φ - Represents feature map after activation i.e. W * H * C
K - Layers used for computing perceptual loss
N - Number of Discriminators
α - weighting term
β - weighting term

FIG. 6

METHODS AND SYSTEMS FOR GENERATING SHAPE DATA FOR ELECTRONIC DESIGNS

RELATED APPLICATIONS

This application is a continuation of U.S. patent application Ser. No. 17/453,321, filed on Nov. 2, 2021, and entitled "Methods and Systems for Generating Shape Data for Electronic Designs"; which is a continuation of U.S. patent application Ser. No. 17/022,363, filed on Sep. 16, 2020, and entitled "Methods and Systems for Generating Shape Data for Electronic Designs"; all of which are hereby incorporated by reference.

BACKGROUND

The present disclosure is related to lithography, and more particularly to the design and manufacture of a surface which may be a reticle, a wafer, or any other surface, using charged particle beam lithography and optical lithography.

Three common types of charged particle beam lithography are unshaped (Gaussian) beam lithography, shaped charged particle beam lithography, and multi-beam lithography. In all types of charged particle beam lithography, charged particle beams shoot energy to a resist-coated surface to expose the resist.

In lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns, the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the important widths or areas of a feature or the important space between two features or important space areas, those dimensions requiring exquisite control.

One goal in integrated circuit fabrication by optical lithography is to reproduce the original circuit design on a substrate by use of a reticle, in which the reticle, sometimes referred to as a mask or a photomask, is a surface which may be exposed using charged particle beam lithography. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. Resolution enhancement technologies performed with a reticle include OPC and inverse lithography technology (ILT).

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is added to improve pattern transference is referred to as "serifs." Serifs are small features that enhance precision or resiliency to manufacturing variation of printing of a particular feature. An example of a serif is a small feature that is positioned on a corner of a pattern to sharpen the corner in the final transferred image. Patterns that are intended to print on the substrate are referred to as main features. Serifs are a part of a main feature. It is conventional to discuss the OPC-decorated patterns to be written on a reticle in terms of main features, that is features that reflect the design before OPC decoration, and OPC features, where OPC features might include serifs, jogs, sub-resolution assist features (SRAFs) and negative features. OPC features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process.

In the manufacture of integrated circuits using a photomask, manufacture of the photomask containing the original circuit design is a critical step of the process. The final photomask must be defect-free, within a pre-determined tolerance, since any defect on the photomask will be reproduced on all wafers manufactured using that photomask. Due to limitations of materials and processes, most or all newly-fabricated photomasks will have imperfections. In a process called mask inspection, a newly-fabricated photomask is analyzed to find imperfections. Each of these imperfections, or potential defects, is then further analyzed to determine if the imperfection is a real defect that will cause a defect on wafers manufactured with this photomask. Imperfections that are identified as real defects can be repaired in a subsequent process called mask repair to create a defect-free photomask suitable for manufacturing wafers.

SUMMARY

Methods for generation of shape data for a set of electronic designs include inputting a set of shape data, where the set of shape data represents a set of shapes for a device fabrication process. A convolutional neural network is used on the set of shape data to determine a set of generated shape data, where the convolutional neural network comprises a generator trained with a pre-determined set of discriminators. The set of generated shape data comprises a scanning electron microscope (SEM) image.

Methods for generation of a SEM image for a set of electronic designs also include inputting a set of shape data, where the set of shape data represents a set of shapes for a device fabrication process. A set of parameters is input, including a set of convolution layers for a Conditional Generative Adversarial Network (CGAN). The CGAN includes a generator and a set of discriminators. A SEM image is generated with the set of shape data, using the set of convolution layers of the CGAN. A generator loss is calculated by combining a perceptual loss with a portion of a discriminator loss, and the set of parameters is adjusted, including the set of convolution layers.

In some embodiments, a system for generation of shape data for a set of electronic designs includes a computer processor configured to receive a set of shape data, wherein the set of shape data represents a set of shapes for a device fabrication process. A computer processor is configured to determine a set of generated shape data, using a convolutional neural network on the set of shape data, wherein the convolutional neural network comprises a generator trained with a set of pre-determined discriminators. The set of generated shape data comprises a generated scanning electron microscope (SEM) image. Each discriminator in the set of pre-determined discriminators handles a different input image size sub-sampled from the generated SEM image.

In some embodiments, a system for training a Conditional Generative Adversarial Network (CGAN) to generate a generated scanning electron microscope (SEM) image for a set of electronic designs includes a computer processor configured to receive a set of shape data, wherein the set of shape data represents a set of shapes for a device fabrication process. A computer processor is configured to receive a set of parameters including a set of convolution layers for the CGAN comprising a generator and a set of discriminators. A computer processor is configured to generate the generated SEM image with the set of shape data, using the set of convolution layers of the CGAN. A computer processor is configured to calculate a generator loss comprising a perceptual loss combined with a portion of a discriminator loss. A computer processor is configured to adjust the set of parameters including the set of convolution layers. Each discriminator in the set of discriminators handles a different input image size sub-sampled from the generated SEM image.

BRIEF DESCRIPTION OF THE DRAWINGS

FIG. 6 shows details of functions used to calculate loss, in accordance with some embodiments.

DETAILED DESCRIPTION

Figure 1:
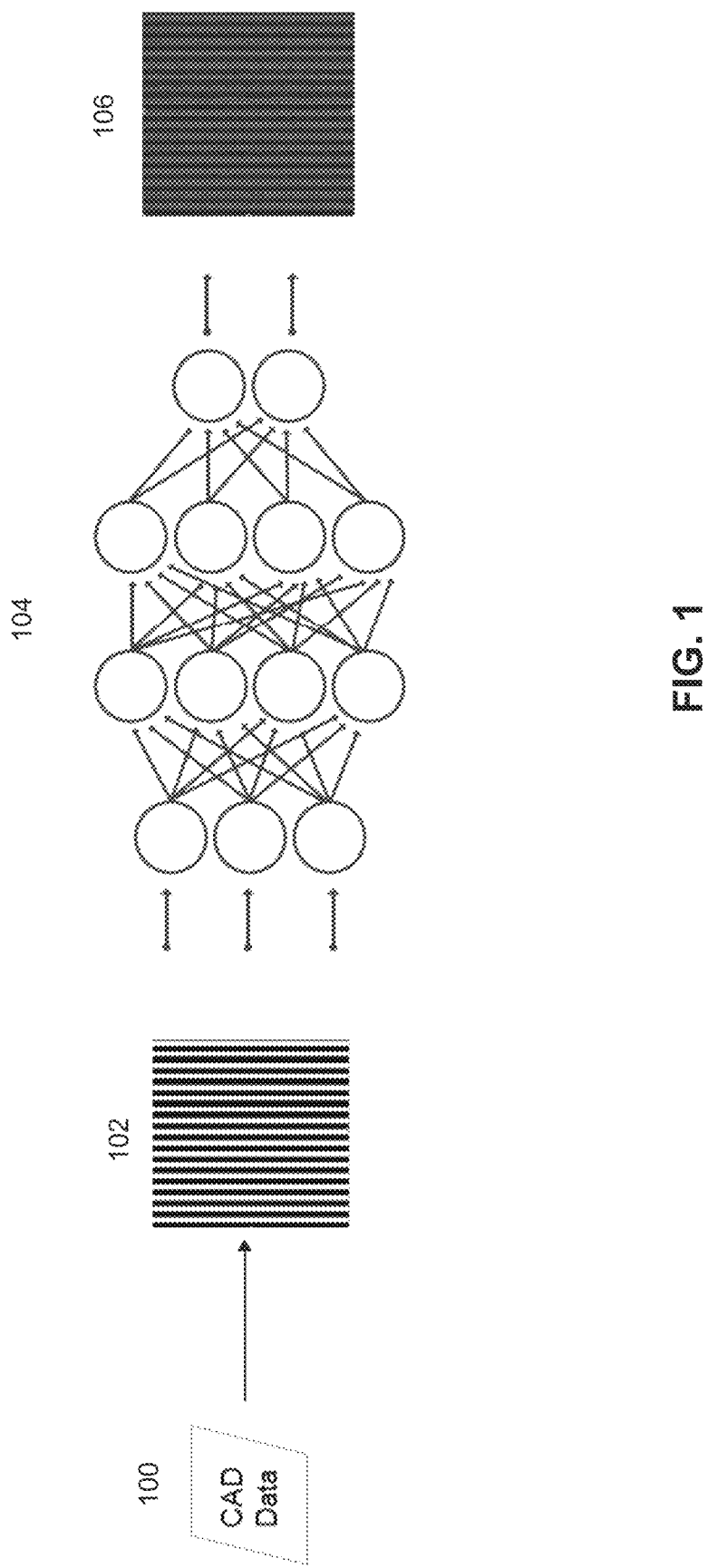
FIG. 1 is a diagram of a method for creating SEM images, in accordance with some embodiments.

Deep learning (DL) has solved problems in a wide range of industries-retail, information technology (IT), medical, pharmaceuticals, biotechnological, and autonomous driving to name just a few. Likewise, deep learning recipes for recommendation, segmentation, classification, anomaly detection and digital modeling are highly relevant to the manufacture of photomasks, printed circuit boards (PCBs) and flat panel displays (FPDs). Photomask shops face challenges with mask inspection, as well as detecting and classifying hotspots, faults and defects that impede production. Deep learning has the potential to solve these challenges before they become real problems on the assembly line. Digital twins that model the properties, conditions and attributes of real-world counterparts in electronics manufacturing have significant advantages over real data in simulating the behavior of the system. Digital twins allow designers to observe, reproduce, and find faults in the system at a software level, long before they stop or slow down an assembly line.

The type of problems deep learning can solve include natural language understanding to extract meaningful information from text documents and information retrieval and language translation. In the speech domain, DL has shown tremendous progress in automatic speech recognition, text-to-speech and realistic-speech generation. Related to computer vision, DL offers effective solutions for a multitude of problems, such as detecting objects, segmenting objects in MRI scans, denoising images, extracting text from images, performing image-based searches, improving the quality of images and even creating new images. DL has introduced advancements in finding anomalies in the form of outliers, by learning the accurate distribution of normal data, so that DL can flag any anomalous data. DL even has the ability to help build digital twins to simulate physical environments.

Many of the problems in photomask industries such as conventional optical proximity correction (OPC), inverse lithography technology (ILT), lithography hotspot detection, fault detection and classification, automatic mask defect classification and diagnostics, and SEM denoising and contour extraction can benefit from deep learning.

Computer-aided engineering (CAE) technology can also be applied to scanning electron microscope (SEM) images of physically manufactured masks or wafers. Such an application may aid in automatically categorizing potential defects such as mask defects. In typical semiconductor manufacturing, potential defects on masks are identified by mask inspection, during which an image of the entire mask is generated. That image is fuzzy and relatively low-resolution, but it is of the entire mask. This mask inspection process is designed to identify questionable spots where further inspection is required. Further inspection is done by taking much more accurate SEM images and analyzing these images. This further inspection is accomplished using a defect inspection SEM machine. Defect inspection SEM machines can take very detailed images, but have a limited field of view, such as 1 μm×1 μm to 10 μm×10 μm. Therefore, potential defect areas are first identified in the full-field mask image generated by mask inspection, then details of the potential defect areas are examined in the SEM. In the leading-edge nodes, the number of suspected areas identified as well as the number of actual defects on a typical production mask are much larger than with earlier nodes. At the beginning of the 21$^{st}$ century, maybe tens of defects on a mask were repaired—masks with more errors than this were discarded and re-manufactured. This has evolved to hundreds of problems being common in leading-edge masks, where all must be repaired. Re-manufacturing of masks has become less common, since a re-manufactured mask will likely also have hundreds of defects. Repairing of defects is unique to mask manufacturing; wafers are not repaired. Masks are worth repairing because an error on the mask will be reproduced on every wafer produced using that mask.

Thus, in some embodiments, the use of SEM images can be used in training of the neural networks of the present methods to help identify mask defects. Simulation of a mask image may also be used in training of the neural networks.

FIG. 1 is a diagram of generating a SEM image starting with simulating a mask image 102 from a physical design 100. The input physical design 100 may also be referred to as shape data for a set of electronic designs, where the set of shape data represents a set of shapes for a device fabrication process. The set of shape data may be created using lithography simulation. The device fabrication process may be, for example, a semiconductor fabrication process or a flat panel display fabrication process, where the process can include mask designs, simulations or manufactured shapes. Once mask image 102 is input to a neural network 104, the SEM image 106 can be generated. Conventional methods for generating SEM images utilize simulation methods only and lack real edge roughness and SEM noise, which are attributes in actual SEM images used in defect analysis.

Figure 2:
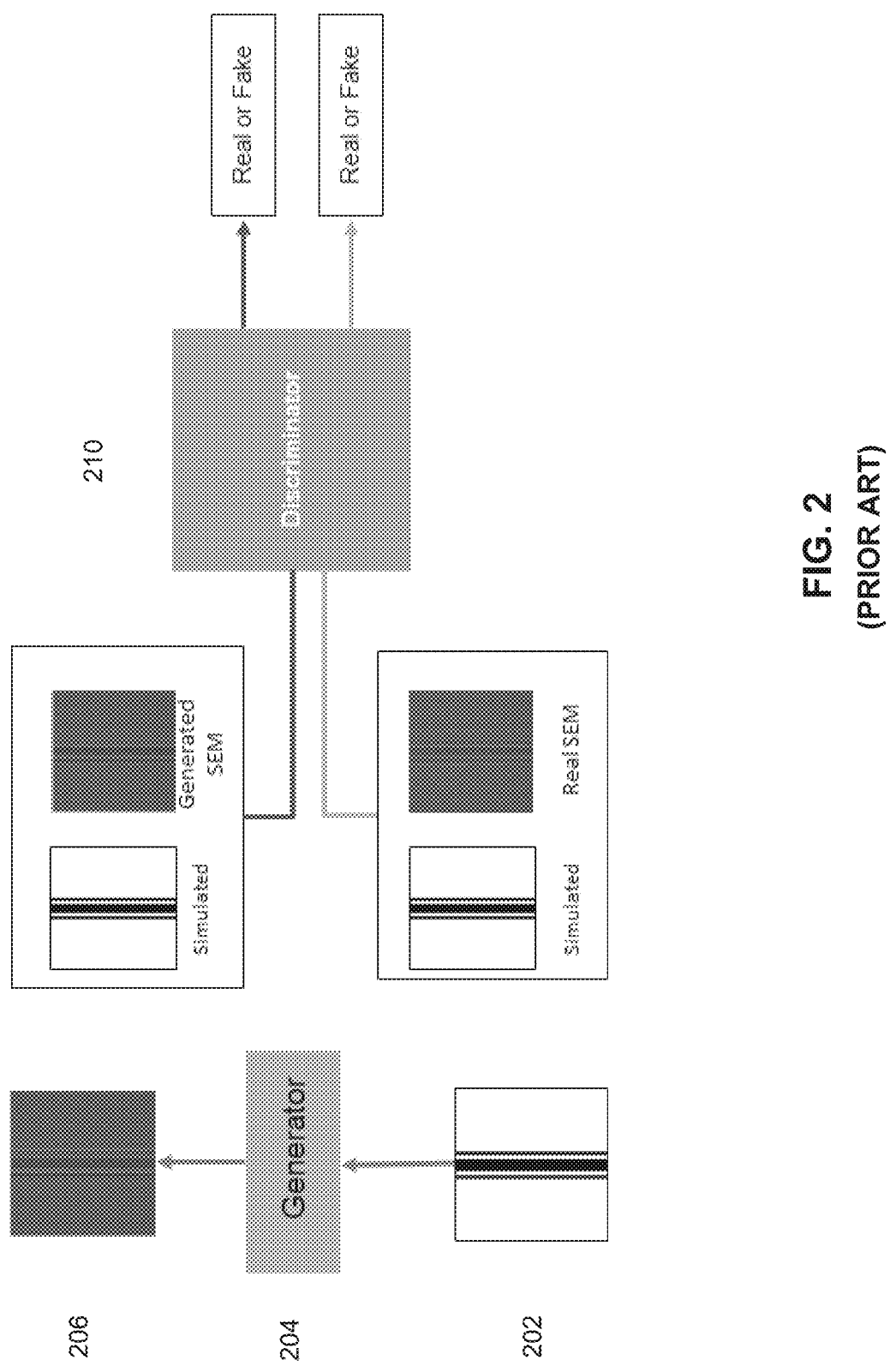
FIG. 2 is a diagram of a neural network architecture for generating SEM images, as known in the art.

Pix2Pix, an example of a known deep learning architecture for general image-to-image translation was used to create realistic looking SEM images. Pix2Pix is an image-to-image translation model that uses Conditional Generative Adversarial Networks (CGANs). Studies have shown the effectiveness of Pix2Pix to synthesize photos from label maps, reconstruct objects from edge maps and colorize images. The original Pix2Pix architecture illustrated in FIG. 2 generates an image with 256×256 pixels. A simulated image 202 is input to a generator 204 to generate a SEM image 206. Pairs of simulated images with generated images and simulated images with real SEM images are input to a discriminator 210 which determines whether the generated image is real (either a real SEM image or 'fooled' to think the generated image is a real SEM image) or fake (generated SEM image). The architecture as illustrated generates artifacts in some areas and color or geometry is compromised in others. As the resolution of the image increases, for example from 256 to 1024, the artifacts are much more visible. The architecture uses L1-loss and GAN loss which only keeps low frequency components of an image.

Figure 3:
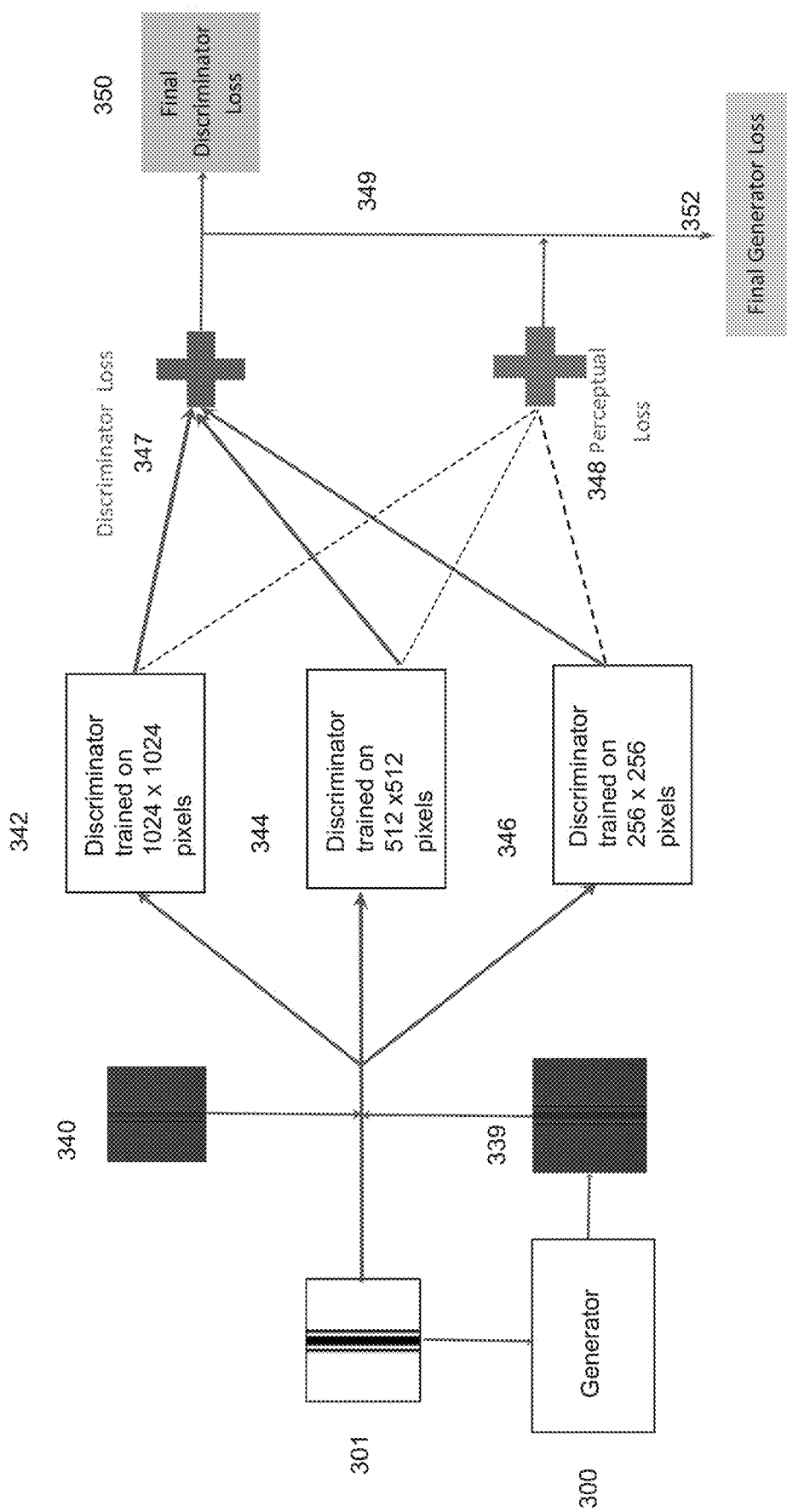
FIG. 3 is a diagram illustrating a neural network architecture for generating SEM images, in accordance with some embodiments.

A neural network is a framework of machine learning algorithms that work together to predict inputs based on a previous training process. In the present embodiments, a CGAN neural network is used to transform a physical design to its corresponding SEM image. A diagram of an embodiment of a neural network is shown in the schematic of FIG. 3, in which a generator 300 uses a simulated image as input 301. The neural network architecture includes three separate discriminators 342, 344 and 346. In some embodiments, at least three pre-determined discriminators may be used, such as three or more. Each discriminator outputs a discriminator loss 347 and a perceptual loss 348. The neural network further comprises a final discriminator loss 350 and a final generator loss 352. The final discriminator loss 350 combines together the discriminator losses 347 that are output from each of the three pre-determined discriminators. The generated SEM image 339 can then be compared to a real SEM image 340 to determine the accuracy of the generator/discriminator neural network. That is, in some embodiments, methods involve inputting an actual SEM image, where the actual SEM image is used by the pre-determined set of discriminators to compare with the set of generated shape data.

In some embodiments, perceptual loss is calculated to preserve high frequency components when generating high resolution images from low resolution images. To compute perceptual loss all the layers of each of the discriminators are used. Perceptual loss allows generation of SEM noise found in real SEM images. In embodiments, the perceptual losses 348 from each of the discriminators is combined with a portion of the discriminator loss 349 to produce a final generator loss 352, which beneficially increases the accuracy of the generated SEM images compared to conventional methods. The discriminator loss is calculated from each discriminator classifying a real SEM image f (X) and simulated CAD data f (Z) pair against SEM images f G(Z) generated from simulated CAD data f (Z) over the number of discriminators. The portion combined with the perpetual loss only comprises loss from the generated SEM images (f G(Z)).

Figure 4:
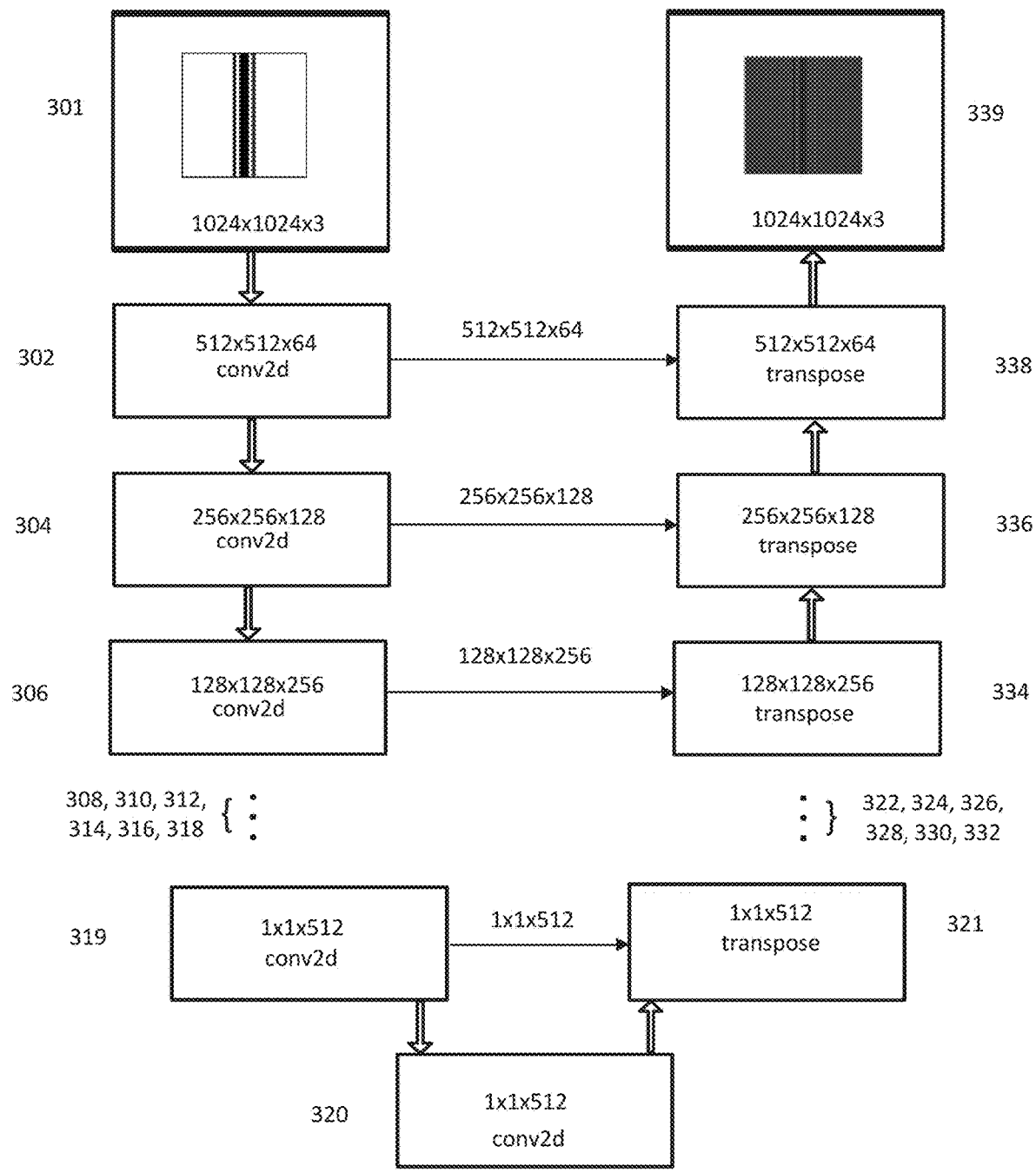
FIG. 4 is a diagram illustrating details of a generator, in accordance with some embodiments.

A more detailed embodiment of the generator 300 of FIG. 3 is illustrated in FIG. 4. Methods involve using the generator to create the set of generated shape data, where the generator includes an encoder and a decoder. A simulated image 301 (i.e., set of shape data, such as a simulated mask image or simulated CAD data) is input to the encoder (made of encoder blocks 302, 304, 306, 308, 310, 312, 314, 316, 318 and 319) and a SEM image 339 is output from the decoder (made of decoder blocks 321, 322, 324, 326, 328, 330, 332, 334, 336 and 338). The generator 300 is comprised of multiple encoder blocks 302, 304, 306 continuing through blocks 308, 310, 312, 314, 316, 318 and 319 up to 10 blocks, reducing the image to 1×1 with a maximum 512 channels in the bottleneck layer 320, followed by multiple decoder blocks 321 continuing through blocks 322, 324, 326, 328, 330, 332, 334, 336 and 338 for up to 10 blocks. The maximum number of blocks is used to convolve an image of 1024 pixels to 1 pixel with 512 channels to get a better representation of the input image. Except for the initial encoder block 302, each encoder block (for example, blocks 304-319) after the first encoder block 302 comprises a convolutional layer, a batch normalization layer and a leaky ReLU (Rectified Linear Unit) activation layer. All decoder blocks from 321-338 comprise a transpose convolution layer. The initial decoder block 321 has a transpose convolution layer and a ReLU activation layer. The subsequent blocks after the initial decoder block 321 in a first set of decoder blocks (e.g., the first half of 10 decoder blocks 322-328) contain a transpose convolution layer, a batch normalization layer and a ReLU activation layer. A second set of the decoder blocks (e.g., the second half of 10 decoder blocks 330-338) comprise the same layers as the first set, plus a dropout layer. The encoder and decoder may comprise up to 10 blocks each with a kernel size of 4×4 and channels (depth) varying from 3, 64, 128, 256 and capped at 512 to preserve memory. For example, encoder blocks may successively increase from 3 channels in a first encoder block to 64 channels. 128 channels. 256 channels and 512 channels in subsequent encoder blocks. Similarly, decoder blocks may successively decrease from 512 channels in a first decoder block to 256, 128, 64 and 3 channels in subsequent decoder blocks.

Unlike prior art, in the present embodiments, 1024×1024 SEM images may be generated. These large 1024×1024 images are needed over conventional 256×256 SEM image sizes, since smaller images impede noise generation. The larger images provide more data to produce SEM noise, which is present in real SEM images and used in defect analysis. When smaller images were used, SEM noise was not generated. Similar to GAN-based models, the models of the present embodiments generate images that can fool the discriminator while the discriminator distinguishes between real images and the images generated by the generator. The generator itself works as an image translation network like a U-Net with skip connections. However, in some embodiments, since a CGAN is used, rather than generating images at random, the generator is conditioned to generate specific images. Generating specific images allows for simulated CAD data to incorporate defects that are then reflected in the SEM images generated. The discriminator works as a convolutional neural network (CNN) which classifies whether the image is real or generated by a generator.

To generate realistic SEM images, a pair of training images, i.e., simulated CAD data and a corresponding real SEM are used to train the model. The generator takes the simulated CAD data as input and tries to create a realistic SEM image from it. The discriminator network takes the real SEM and generated SEM image and the simulated CAD data as input. The discriminator then classifies whether the SEM image is generated (fake) or real.

Figure 5:
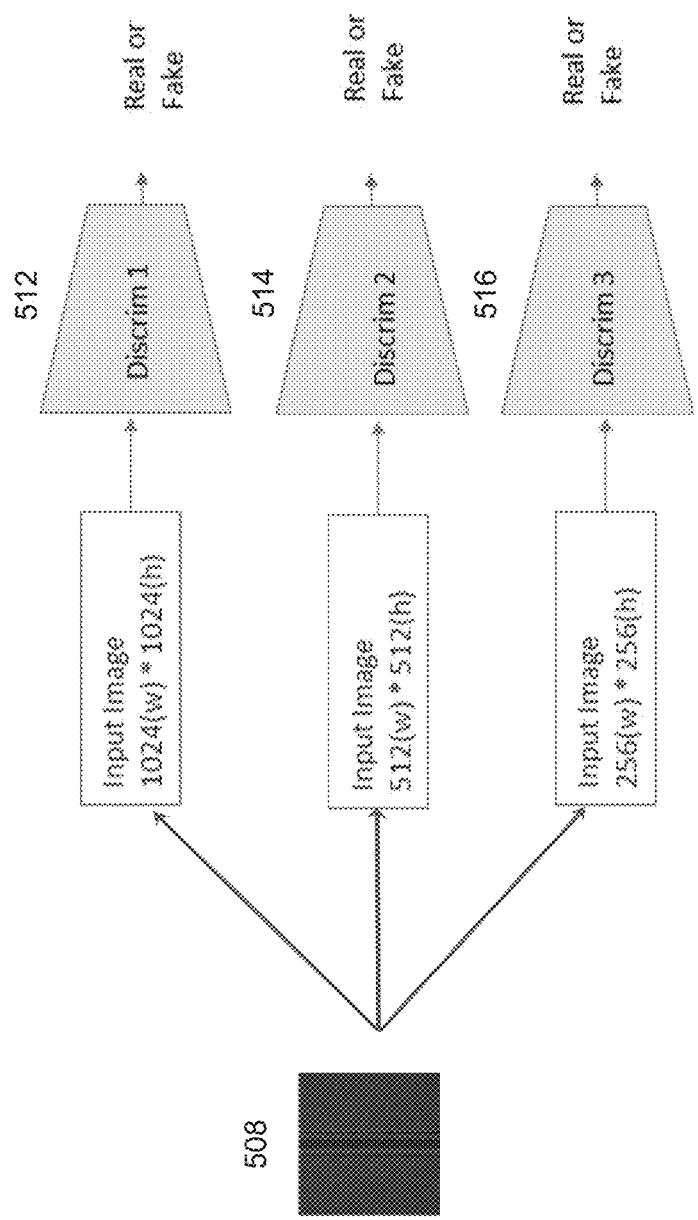
FIG. 5 is diagram illustrating details of a set of discriminators, in accordance with some embodiments.

In some embodiments, multiple discriminators with different input image sizes can be used to remove repeating patterns. FIG. 5 illustrates a model with multiple discriminators 512, 514 and 516 each handling different input image sizes which are sub-sampled from image 508. The different discriminators work as hard and soft critics for real or generated images. Each of the discriminators are trained to receive a different sized portion (e.g., 1, ½, and ¼) of the original image (real or generated) using, for example, a 70×70 receptive field for patch penalization (which would need to be doubled in the original image size for each reduced portion, 140×140 for the H size portion and 280×280 for the % size portion). The differences in patch penalization allows for more correct SEM features and noise dispersion. With only one discriminator the network learns quickly, and the generator keeps generating images that are easily classified as fake. With multiple discriminators, each discriminator in the present embodiments is configured to have different receptive fields, smaller to larger, based on sub-sampling. At least one of the discriminators out of the three or more might not be certain that an image is fake thus helping the generator learn. Multiple discriminators also reduce the occurrence of repeating patterns in the generated images as seen in models with a single discriminator.

The multiple discriminators are pre-determined; that is, the set of discriminators are pre-determined in the image size they will handle and the types of layers and blocks they are configured with. In the embodiment of FIG. 5, a first pre-determined discriminator 512 is trained with 1024×1024 pixel images, a second pre-determined discriminator 514 is trained with 512×512 pixel images, and a third pre-determined discriminator 516 is trained with 256×256 pixel images. Each discriminator comprises multiple layers or classifier blocks. For example, each discriminator may include a plurality of classifier blocks. In some embodiments, a first block (initial layer) contains a convolutional layer, a leaky ReLU activation layer and a padding layer. In addition, subsequent layers include a batch normalization layer. The final layer contains a convolutional layer, a padding layer and a sigmoid activation layer. In addition, the size of the input to each discriminator is halved in only the first 2 layers and reduced by 1 in width and height in each subsequent layer. The discriminators may comprise a kernel size of 4×4 and channels (depth) varying from 6, 64, 128, 256 and capped at 512 to preserve memory. In an example embodiment, a second block, a third block, a fourth block, a fifth block and a sixth block each include a convolution layer, a batch normalization layer, a leaky ReLU activation layer and a padding layer; and a seventh block includes a convolution layer, a padding layer and a sigmoid activation layer. The number of blocks may be chosen to balance accuracy with efficiency of training. For example, at a certain number of blocks the increased computation time from adding more blocks may not provide significant gain in the results produced.

In some embodiments, methods involve inputting a set of shape data, such as a simulated image 301, where the set of shape data represents a set of shapes for a device fabrication process, and inputting a set of parameters including a set of convolution layers for a CGAN (e.g., convolution layers 302-319 and 321-338 of FIG. 4). The methods also involve generating a SEM image 339 with the set of shape data such as a simulated image 301, by using the set of convolution layers of the CGAN. The methods further involve calculating a loss comprising a perceptual loss 348 combined with a portion 349 of an accumulated discriminator loss 350, and adjusting the set of parameters including the set of convolution layers. The adjusting may be performed by repeating a loop from the final generator loss 352 to generator 300. The parameters that may be adjusted in training the CGAN include, for example, learning rates, perceptual loss weights, and the number of discriminators. In some embodiments the set of parameters comprises a kernel size of 4×4 with channels varying from 3, 64, 128, 256 and 512 for each convolution layer. For example, encoder layers may increase from 3 channels to 64, 128, 256 and 512 in following encoder layers, while decoder layers may decrease from 512 channels to 256, 128, 64 and 3 in following decoder layers.

FIG. 6 shows details of example functions used to calculate loss, in accordance with some embodiments. The discriminator loss is calculated from each discriminator classifying a real SEM image f (X) and simulated CAD data f (Z) pair against SEM images f G(Z) generated from simulated CAD data f (Z) over the number of discriminators. The generator loss combines the discriminator loss of the SEM images f G(Z) generated from simulated CAD data f (Z) over the number of discriminators with the perceptual loss. The perceptual loss is an adversarial loss combined with a content loss motivated by perceptual similarity instead of similarity of pixel space. The perceptual loss is calculated from each discriminator classifying real SEM image f(X) and simulated CAD data f(Z) pairs against SEM images f(G(Z)) generated from simulated CAD data f (Z) over all layers of the discriminators.

Figure 7:
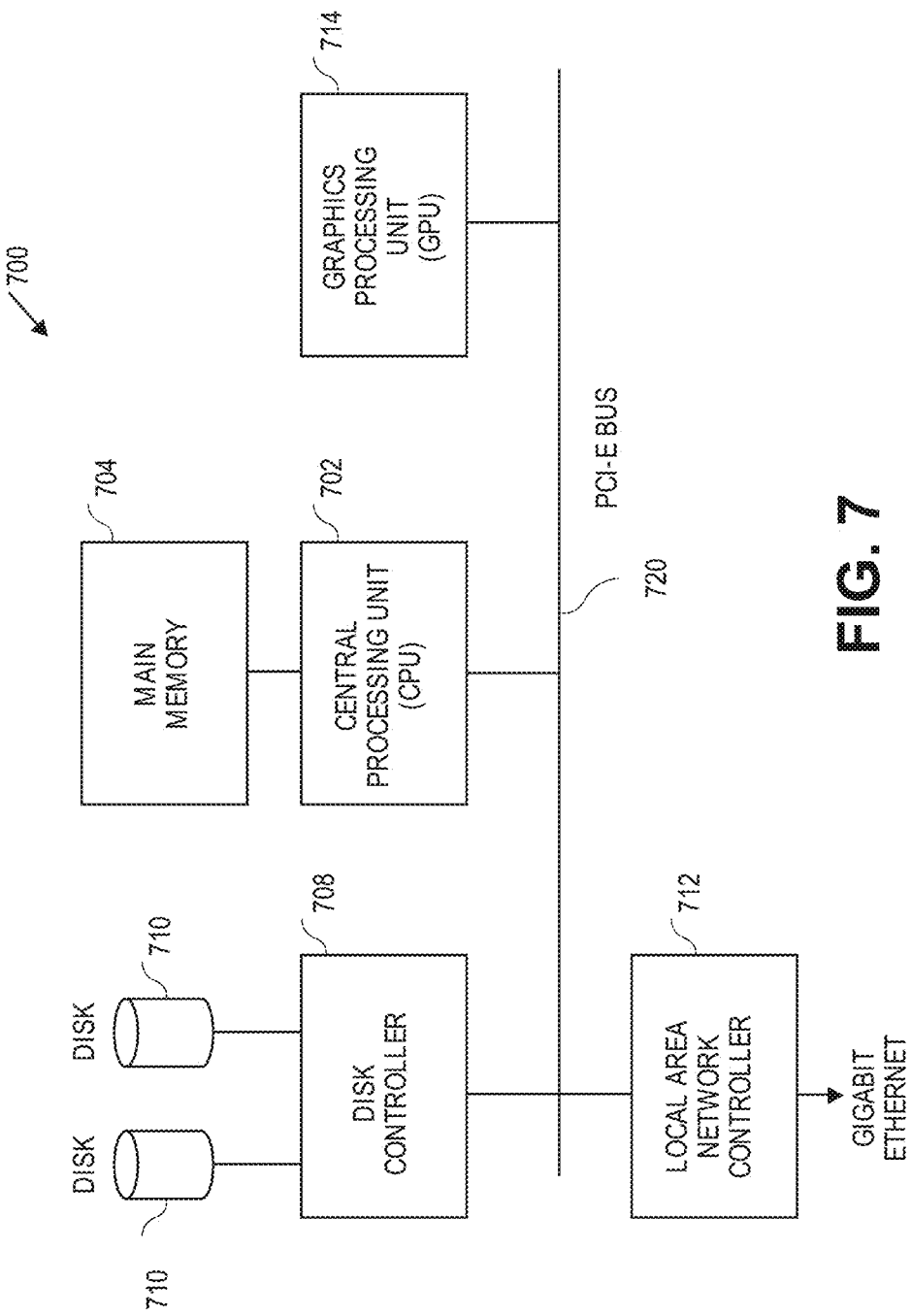
FIGS. 7 and 8 are schematics of GPU systems, in accordance with some embodiments.

FIG. 7 illustrates an example of a computing hardware device 700 that may be used to perform the calculations described in this disclosure. Example calculations include processing convolution and deconvolution layers of a neural network, calculating and comparing loss as well as compressing mask data with a trained neural network. Computing hardware device 700 comprises a central processing unit (CPU) 702, with attached main memory 704. The CPU may comprise, for example, eight processing cores, thereby enhancing performance of any parts of the computer software that are multi-threaded. The size of main memory 704 may be, for example, 64 G-bytes. The CPU 702 is connected to a Peripheral Component Interconnect Express (PCIe) bus 720. A graphics processing unit (GPU) 714 is also connected to the PCIe bus. In computing hardware device 700 the GPU 714 may or may not be connected to a graphics output device such as a video monitor. If not connected to a graphics output device, GPU 714 may be used purely as a high-speed parallel computation engine. The computing software may obtain significantly higher performance by using the GPU for a portion of the calculations, compared to using CPU 702 for all the calculations. The CPU 702 communicates with the GPU 714 via PCIe bus 720. In other embodiments (not illustrated) GPU 714 may be integrated with CPU 702, rather than being connected to PCIe bus 720. Disk controller 708 may also be attached to the PCIe bus, with, for example, two disks 710 connected to disk controller 708. Finally, a local area network (LAN) controller 712 may also be attached to the PCIe bus, and provides Gigabit Ethernet (GbE) connectivity to other computers. In some embodiments, the computer software and/or the design data are stored on disks 710. In other embodiments, either the computer programs or the design data or both the computer programs and the design data may be accessed from other computers or file serving hardware via the GbE Ethernet.

Figure 8:
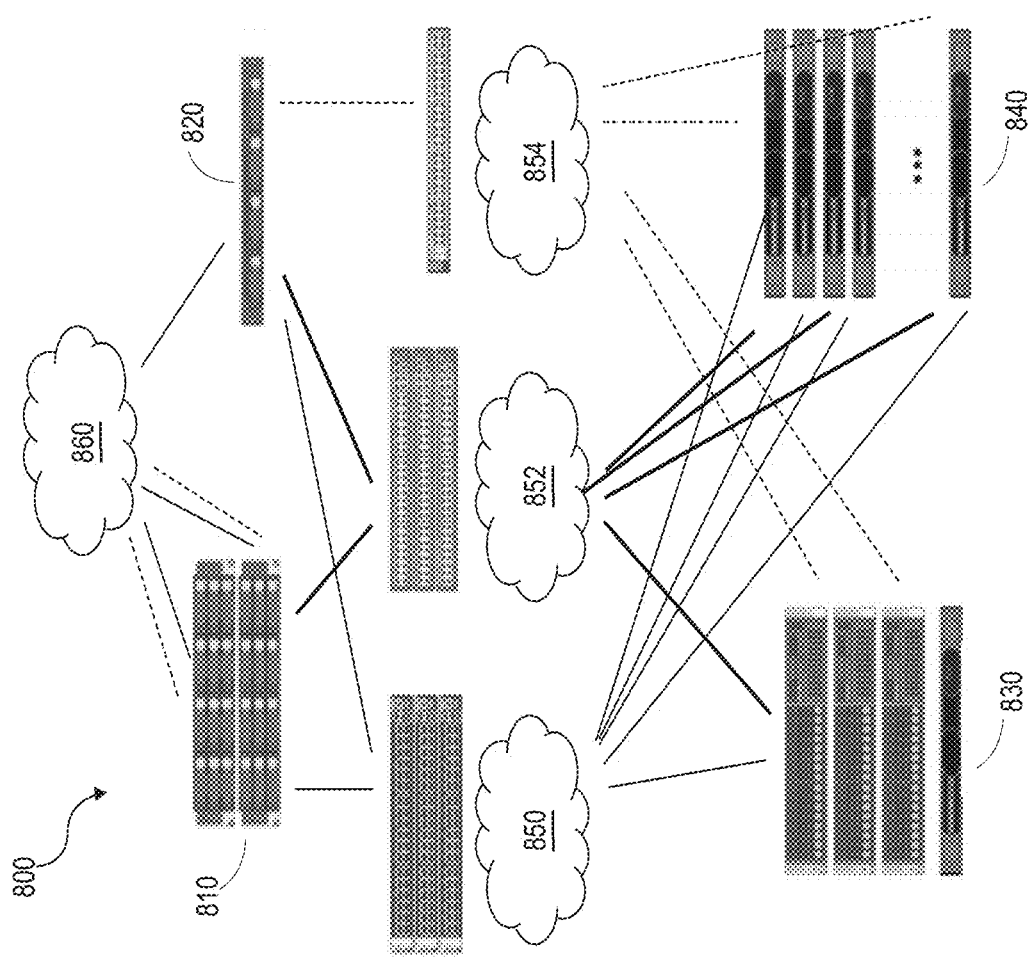

FIG. 8 is another embodiment of a system for performing the computations of the present embodiments. The system 800 may also be referred to as a Computational Design Platform (CDP), and includes a master node 810, an optional viewing node 820, an optional network file system 830, and a GPU-enabled computing node 840. Viewing node 820 may not exist or instead have only one node, or may have other numbers of nodes. GPU-enabled computing node 840 can include one or more GPU-enabled nodes forming a cluster. Each GPU-enabled computing node 840 may be, for example, a GPU, a CPU, a paired GPU and CPU, multiple GPUs for a CPU, or other combinations of GPUs and CPUs. The GPU and/or CPU may be on a single chip, such as a GPU chip having a CPU that is accelerated by the GPU on that chip, or a CPU chip having a GPU that accelerates the CPU. A GPU may be substituted by other co-processors.

The master node 810 and viewing node 820 may be connected to network file system 830 and GPU-enabled computing nodes 840 via switches and high-speed networks such as networks 850, 852 and 854. In an example embodiment, networks 850 can be a 56 Gbps network, 852 can be a 1 Gbps network and 854 can be a management network. In various embodiments, fewer or greater numbers of these networks may be present, and there may be various combinations of types of networks such as high and low speeds. The master node 810 controls the CDP system 800. Outside systems can connect to the master node 810 from an external network 860. In some embodiments, a job is launched from an outside system. The data for the job is loaded onto the network file system 830 prior to launching the job, and a program is used to dispatch and monitor tasks on the GPU-enabled computing nodes 840. The progress of the job may be seen via a graphical interface, such as the viewing node 820, or by a user on the master node 810. The task is executed on the CPU using a script which runs the appropriate executables on the CPU. The executables connect to the GPUs, run various compute tasks, and then disconnect from the GPU. The master node 810 can also be used to disable any failing GPU-enabled computing nodes 840 and then operate as though that node did not exist.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods may be practiced by those of ordinary skill in the art, without departing from the scope of the present subject matter, which is more particularly set forth in the appended claims. Furthermore, those of ordinary skill in the art will appreciate that the foregoing description is by way of example only and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A system for generation of shape data for a set of electronic designs, the system comprising:
   a computer processor configured to receive a set of shape data, wherein the set of shape data represents a set of shapes for a device fabrication process; and
   a computer processor configured to determine a set of generated shape data, using a convolutional neural network on the set of shape data, wherein the convolutional neural network comprises a generator trained with a set of pre-determined discriminators;
   wherein the set of generated shape data comprises a generated scanning electron microscope (SEM) image; and
   wherein each discriminator in the set of pre-determined discriminators handles a different input image size sub-sampled from the generated SEM image.

2. The system of claim 1 wherein the set of shape data is created using lithography simulation.

3. The system of claim 1 wherein the set of pre-determined discriminators comprises at least three pre-determined discriminators.

4. The system of claim 3 wherein each pre-determined discriminator in the set of pre-determined discriminators outputs a discriminator loss and a perceptual loss.

5. The system of claim 4 wherein the discriminator losses from the pre-determined discriminators in the set of pre-determined discriminators are combined together to form a final discriminator loss.

6. The system of claim 5 wherein a portion of the discriminator loss of each of the pre-determined discriminators in the set of pre-determined discriminators and a portion of the perceptual loss of each of the pre-determined discriminators in the set of pre-determined discriminators are combined to produce a final generator loss.

7. The system of claim 3 wherein the set of pre-determined discriminators comprises:
   a first pre-determined discriminator trained with 1024× 1024 pixel input image size;
   a second pre-determined discriminator trained with 512× 512 pixel input image size; and
   a third pre-determined discriminator trained with 256× 256 pixel input image size.

8. The system of claim 3 wherein each pre-determined discriminator comprises a plurality of classifier blocks.

9. The system of claim 8 wherein the plurality of classifier blocks comprises:
   a first block comprising a convolution layer, a leaky Rectified Linear Unit (ReLU) activation layer and a padding layer;
   a second block, a third block, a fourth block, a fifth block and a sixth block each comprising a convolution layer, a batch normalization layer, a leaky ReLU activation layer and a padding layer; and
   a seventh block comprising a convolution layer, a padding layer and a sigmoid activation layer.

10. The system of claim 1 further comprising a computer processor configured to receive an actual SEM image.

11. The system of claim 10 wherein the actual SEM image is used by the set of pre-determined discriminators to compare with the set of generated shape data.

12. The system of claim 1 further comprising:
a computer processor configured to create the set of generated shape data, using the generator, wherein the generator comprises an encoder and a decoder.

13. The system of claim 12 wherein the encoder further comprises a plurality of encoder blocks, wherein each encoder block after a first encoder block in the plurality of encoder blocks comprises a batch normalization layer, a convolution layer and a leaky ReLU activation layer.

14. The system of claim 12 wherein the decoder further comprises a plurality of decoder blocks, wherein:
an initial decoder block in the plurality of decoder blocks comprises a transpose convolution layer and a ReLU activation layer; followed by
a first set of decoder blocks comprising a transpose convolution layer, a batch normalization layer and a ReLU activation layer; and
a second set of decoder blocks comprising a transpose convolution layer, a batch normalization layer, a drop-out layer and a ReLU activation layer.

15. The system of claim 1 wherein the device fabrication process is a semiconductor fabrication process.

16. The system of claim 1 wherein the device fabrication process is a flat panel display fabrication process.

17. The system of claim 1 wherein the set of shape data further comprises a simulated mask image.

18. A system for training a Conditional Generative Adversarial Network (CGAN) to generate a generated scanning electron microscope (SEM) image for a set of electronic designs, the system comprising:
a computer processor configured to receive a set of shape data, wherein the set of shape data represents a set of shapes for a device fabrication process;
a computer processor configured to receive a set of parameters including a set of convolution layers for the CGAN comprising a generator and a set of discriminators;
a computer processor configured to generate the generated SEM image with the set of shape data, using the set of convolution layers of the CGAN;
a computer processor configured to calculate a generator loss comprising a perceptual loss combined with a portion of a discriminator loss; and
a computer processor configured to adjust the set of parameters including the set of convolution layers;
wherein each discriminator in the set of discriminators handles a different input image size sub-sampled from the generated SEM image.

19. The system of claim 18 wherein the set of parameters comprises a kernel size of 4×4 with channels varying from 3, 64, 128, 256 and 512 for each convolution layer.

20. The system of claim 18 wherein the portion of the discriminator loss is combined from the set of discriminators.

21. The system of claim 18 wherein the generator further comprises a U-net.

* * * * *